(12) United States Patent
Shimmura et al.

(10) Patent No.: US 12,257,611 B2
(45) Date of Patent: Mar. 25, 2025

(54) CLEANING JIG, COATING APPARATUS, AND CLEANING METHOD

(71) Applicant: Tokyo Electron Limited, Tokyo (JP)

(72) Inventors: Satoshi Shimmura, Kumamoto (JP); Koji Takayanagi, Kumamoto (JP); Kenta Shibasaki, Kumamoto (JP); Hiroichi Inada, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/914,108

(22) PCT Filed: Mar. 15, 2021

(86) PCT No.: PCT/JP2021/010392
§ 371 (c)(1),
(2) Date: Sep. 23, 2022

(87) PCT Pub. No.: WO2021/193200
PCT Pub. Date: Sep. 30, 2021

(65) Prior Publication Data
US 2024/0207908 A1  Jun. 27, 2024

(30) Foreign Application Priority Data

Mar. 27, 2020 (JP) ................. 2020-057079

(51) Int. Cl.
*B08B 13/00* (2006.01)
*B05C 11/08* (2006.01)
(Continued)

(52) U.S. Cl.
CPC ............. *B08B 9/08* (2013.01); *B05C 11/08* (2013.01); *B05C 21/00* (2013.01); *G03F 7/162* (2013.01); *B08B 2209/08* (2013.01)

(58) Field of Classification Search
None
See application file for complete search history.

(56) References Cited

FOREIGN PATENT DOCUMENTS

| JP | H02-252232 A | 10/1990 |
|----|--------------|---------|
| JP | 2010-016315 A | 1/2010 |
| TW | 418452 B | 1/2001 |

OTHER PUBLICATIONS

Google Patents translation of JP2010016315A (Year: 2024).*
International Search Report issued on May 11, 2021 for WO 2021/193200 A1 (4 pages).

* cited by examiner

*Primary Examiner* — Eric W Golightly
(74) *Attorney, Agent, or Firm* — Venjuris, P.C.

(57) ABSTRACT

A cleaning jig of a disc shape used for cleaning an inside of a container while being held by a rotary holding device in a same manner as a substrate in a spin coating apparatus that supplies a processing liquid onto a substrate held by the rotary holding device disposed in the container and forms a film of the processing liquid on the substrate by rotating the substrate. A peripheral ceiling portion and a peripheral bottom portion are formed over an entire periphery of the cleaning jig, a discharge port is formed over the entire periphery between the peripheral ceiling portion and the peripheral bottom portion, a plurality of holes is formed in the peripheral bottom portion at intervals in a circumferential direction to communicate with the discharge port, and a lower surface of the peripheral ceiling portion is inclined toward an upper periphery.

10 Claims, 4 Drawing Sheets

(51) Int. Cl.
 *B05C 21/00* (2006.01)
 *B08B 9/08* (2006.01)
 *G03F 7/16* (2006.01)

CLEANING JIG, COATING APPARATUS, AND CLEANING METHOD

CROSS REFERENCE TO RELATED APPLICATIONS

This application is a national phase of PCT application No. PCT/JP2021/010392, filed on 15 Mar. 2021, which claims priority from Japanese patent application No. 2020-057079, filed on 27 Mar. 2020, all of which are incorporated herein by reference.

TECHNICAL FIELD

The present disclosure relates to a cleaning jig, a coating apparatus, and a cleaning method.

BACKGROUND OF THE INVENTION

Patent Document 1 discloses a cleaning jig used for cleaning a container in a spin coating apparatus that drops a processing liquid onto a substrate rotatably held in the container and applies a film of the processing liquid onto the substrate by rotating the substrate. The cleaning jig includes an outer peripheral surface formed to hold a solvent supplied to the back surface thereof and guided by rotation, and to scatter the solvent into the container when rotated in the spin coating apparatus.

PRIOR ART DOCUMENT

Patent Document

Patent Document 1: Japanese Patent Laid-Open Publication No. 2010-016315

BRIEF SUMMARY OF THE INVENTION

Problems to be Solved

The technique according to the present disclosure cleans a wider range of a spin coating apparatus in the height direction than that in the related art when cleaning the inside of a container of the spin coating apparatus.

Means to Solve the Problems

An aspect of the present disclosure relates to a cleaning jig of a disc shape used for cleaning an inside of a container in a spin coating apparatus that supplies a processing liquid onto a substrate held by a rotary holding device disposed in a container and forms a film of the processing liquid on the substrate by rotating the substrate. A peripheral ceiling portion and a peripheral bottom portion are formed over an entire periphery of the cleaning jig, a discharge port is formed over an entire periphery between the peripheral ceiling portion and the peripheral bottom portion, a plurality of holes is formed in the peripheral bottom portion at intervals in a circumferential direction to communicate with the discharge port, and a lower surface of the peripheral ceiling portion is inclined toward an upper periphery.

Effect of the Invention

According to the present disclosure, when cleaning the inside of the container of a spin coating apparatus, it is possible to clean a wider range in the height direction than that in the related art.

DETAILED DESCRIPTION OF THE INVENTION

Figure 1:
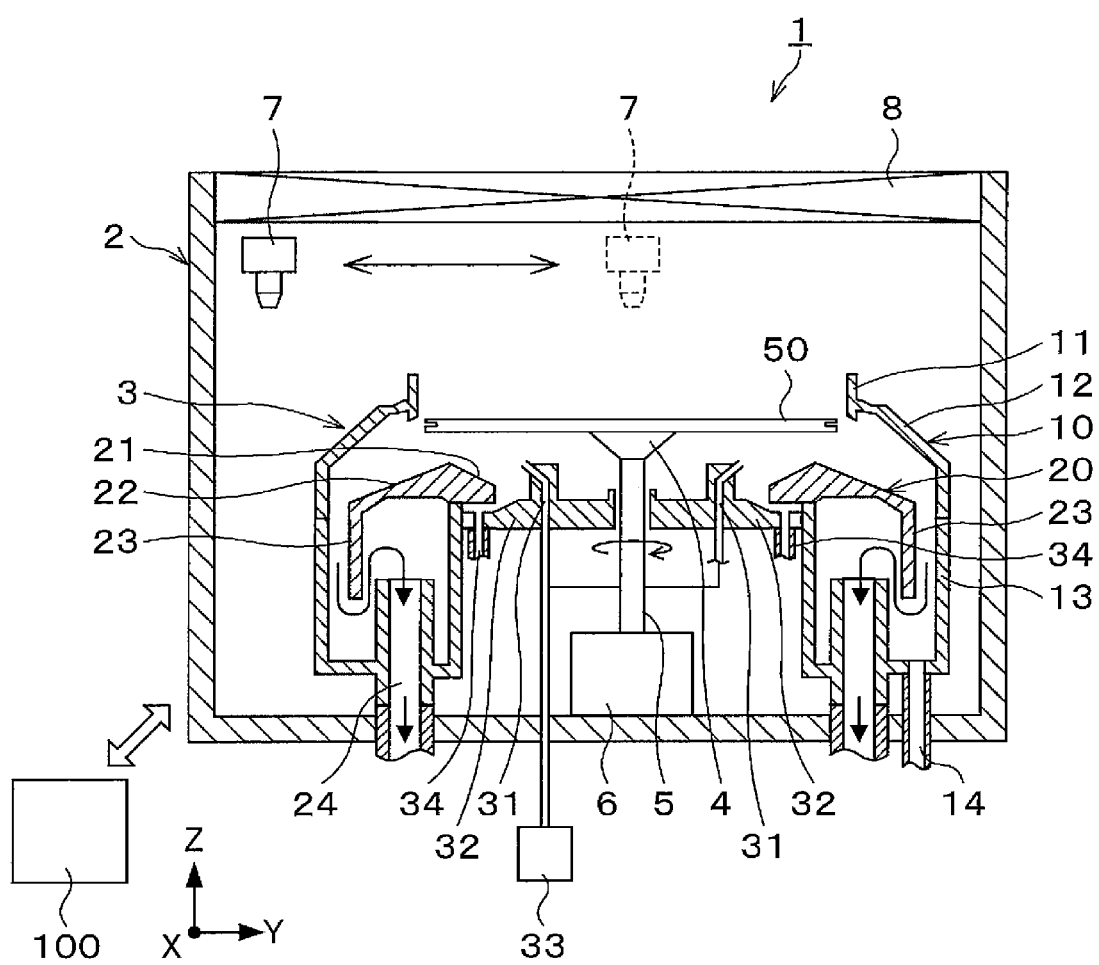
FIG. 1 is a view schematically illustrating a side cross-section of a spin coating apparatus to which a cleaning jig according to an embodiment is applied.

In a semiconductor device manufacturing process, a coating liquid such as a resist liquid is applied to a substrate, for example, a semiconductor wafer (hereinafter, sometimes referred to as a "wafer") by spin coating. Such spin coating is performed by supplying a coating liquid from above a wafer held by a spin chuck and rotating the wafer. In such a case, since the coating liquid scatters from the upper surface of the wafer, a container for receiving the scattered coating liquid is disposed to surround the wafer.

The coating liquid that scatters in the container and adheres to the inner wall of the container is washed regularly. According to the technique described in Patent Document 1, a solvent supplied to the back surface and guided by rotation is held and scattered into the container. Also, it is possible to use a cleaning liquid from a nozzle for cleaning the back surface as it is, and to clean the inner wall of the container in the manner of spin coating for a normal wafer.

For example, with respect to a resist liquid, in recent years, a process with a film thickness of about 10 μm may be adopted from the viewpoint of etching resistance. In such a case, the resist liquid to be used has a high viscosity of, for example, 50 cP to 600 cP. Since the high-viscosity resist liquid has a higher solid content than the low-viscosity resist liquid of the related art, the high-viscosity resist liquid may scatter and adhere to the upper part of the container during spin coating.

In the related technique, the range in the height direction that may be cleaned is almost horizontal, and there has been a need for a technique that enables a wider range of cleaning in the height direction. Therefore, according to the present disclosure, it is possible to wash a wider range in the height direction inside the container than that in the related art.

A cleaning jig according to the present embodiment will be described below with reference to the accompanying drawings. In the present specification, elements having substantially the same functional configuration are denoted by the same reference numerals, thereby omitting redundant descriptions.

<Spin Coating Apparatus>

First, descriptions will be made on the configuration of a spin coating apparatus in which a container is cleaned using a cleaning jig according to an embodiment. As illustrated in FIG. 1, a spin coating apparatus 1 as a coating apparatus includes, for example, a rectangular parallelepiped housing 2 and a container 3 accommodated in the housing 2. The container 3 has an outer cup 10 and an inner cup 20.

A spin chuck 4 is provided inside the outer cup 10 to horizontally hold a wafer, which is a substrate, and a cleaning jig 50 (to be described later) during coating process. The spin chuck 4 is rotatable via a shaft portion 5 by a driving apparatus 6 having a motor, and is movable vertically (in the Z direction). The spin chuck 4 constitutes a rotary holding device. A coating nozzle 7 is provided in the housing 2 to supply a coating liquid to the wafer held on the spin chuck 4. As illustrated in FIG. 1, the coating nozzle 7 is movable in the Y direction in the drawing between a standby position (indicated by a solid line) and a supply position (indicated by a broken line). A clean air supply unit 8 such as a filter apparatus for supplying clean air to the container 3 is provided on the top plate of the housing 1. A down flow of clean air is formed by the clean air supply unit 8.

One or more cleaning nozzles 31 are provided on the lower surface of the spin chuck 4 to supply a cleaning liquid obliquely upward from the center toward the substrate held by the spin chuck 4 and the back surface of the cleaning jig 50. Two cleaning nozzles 31 are provided in the illustrated example. The cleaning nozzles 31 are supported by a base portion 32. A cleaning liquid, for example, a coating liquid supplied by the coating nozzle 7, such as a solvent of a resist liquid is supplied from a solvent supply unit 33 to the cleaning nozzle 31.

The outer cup 10 has an upper surface that is opened in a circular shape and surrounds the substrate held by the spin chuck 4 and the cleaning jig 50. A cylindrical block body 11 is provided at the top of the outer cup 10, and a slope portion 12 and an outer peripheral cylindrical portion 13 are continuously provided downward from the cylindrical block body 11. The cylindrical lock body 11 has the function of suppressing the mist in the outer cup 10 from being discharged to the outside and properly guiding the downflow into the outer cup 10.

Meanwhile, the inner cup 20 has an inner slope portion 21 and an outer slope portion 22 as illustrated in FIG. 1. The inner slope portion 21 discharges the cleaning jig 50 held by the spin chuck 4 and the coating liquid and solvent that scatter on the lower surface of the substrate toward a drain port 34 provided in the base portion 32. The outer slope portion 22 discharges the coating liquid and the solvent together with the coating liquid and the solvent received by the outer cup 10 from the drain port 14 provided at the bottom of the outer cylindrical portion 13 through a space between the hanging wall 23 and the outer cylindrical portion 13. Steam and mist pass through the space between the hanging wall 23 and the outer cylindrical portion 13 and are exhausted from an exhaust portion 24 as indicated by the arrows in FIG. 1.

The spin coating apparatus 1 is configured as described above, and various operations are controlled by a control unit 100 illustrated in FIG. 1. The control unit 100 is, for example, a computer equipped with a CPU and a memory and has a program storage unit (not illustrated). In the program storage unit, a program for performing a coating process on a substrate in the spin coating apparatus 1, a cleaning process by the cleaning jig 50, a process of controlling various drive systems such as the spin chuck 4 associated therewith, and a process of controlling the discharge and stop of the processing liquid from various nozzles is stored. The program may be recorded in a computer-readable storage medium and installed from the storage medium to the control unit 100. A part or entirety of the program may be implemented by dedicated hardware (circuit board). The storage medium includes temporary and non-temporary storage media.

<Cleaning Jig>

Figure 2:
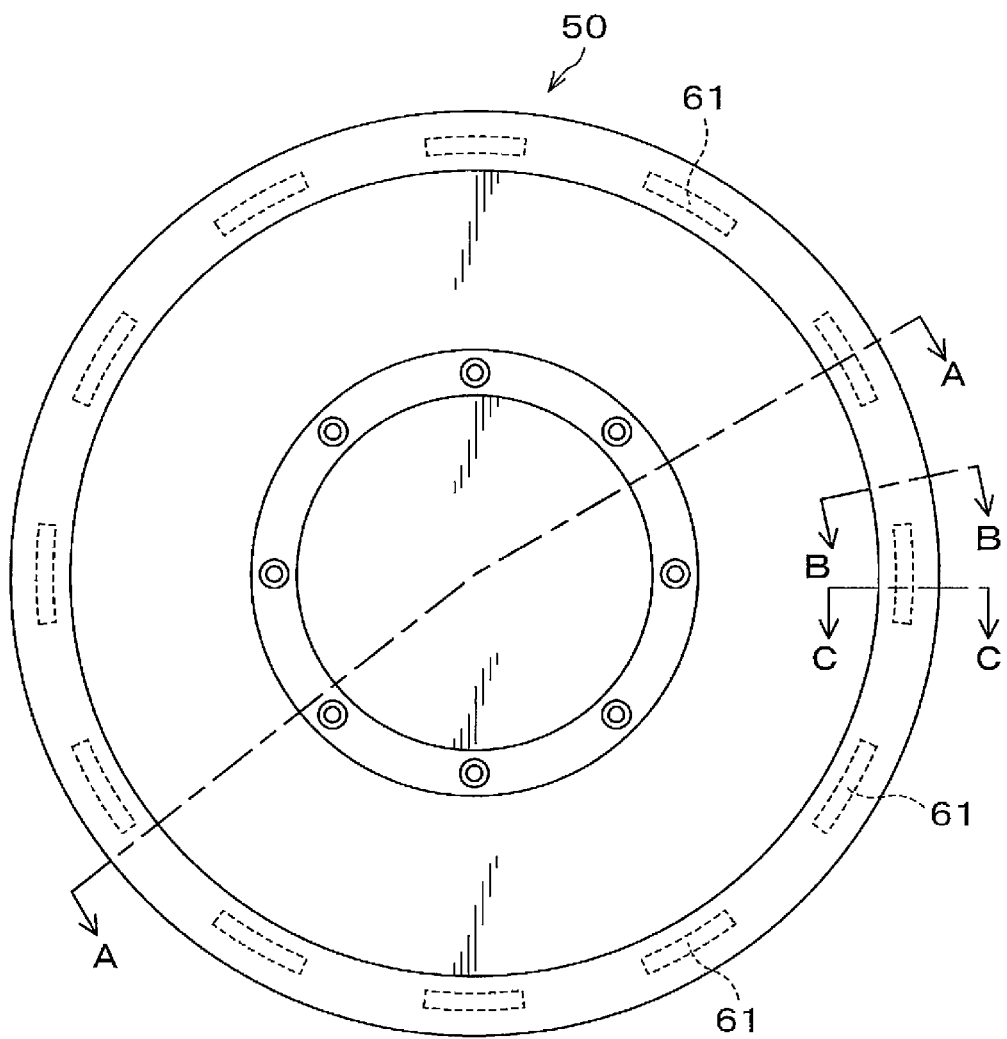
FIG. 2 is a plan view of the cleaning jig according to the embodiment.
Figure 3:
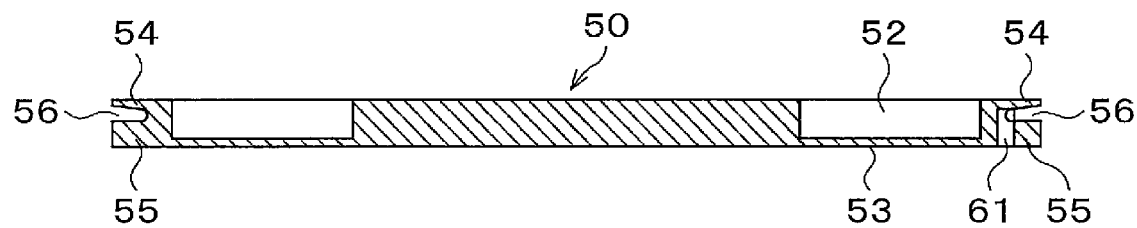
FIG. 3 is a cross-sectional view taken along line A-A of FIG. 2.
Figure 4:
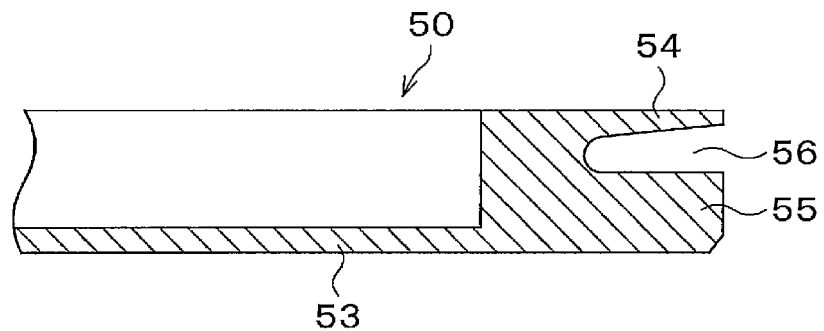
FIG. 4 is a cross-sectional view taken along line B-B in FIG. 2.

Next, the cleaning jig 50 according to the embodiment will be described in detail. FIG. 2 is a plan view of the cleaning jig 50, FIG. 3 is a cross-sectional view taken along the A-A line in FIG. 2, FIG. 4 is a cross-sectional view taken along the B-B line in FIG. 2, and FIG. 5 is a cross-sectional view taken along the line C-C in which the cleaning jig 50 is disk-shaped as a whole and has the same shape and size as the wafer except for the thickness.

An annular concave portion 52 is formed in the periphery of the upper surface of the cleaning jig 50. An annular flat bottom portion 53 facing the concave portion 52 is formed on the lower surface of the concave portion 52. An annular peripheral ceiling portion 54 is provided on the outside of the annular concave portion 52 of the cleaning jig 50 to protrude outward over the entire periphery. An annular peripheral bottom portion 55 extending from the bottom portion 53 and protruding outward over the entire periphery is formed in a portion facing the peripheral ceiling portion 54. An annular discharge port 56 is formed over the entire periphery of the cleaning jig 50 between the peripheral ceiling portion 54 and the peripheral bottom portion 55. In the present embodiment, the discharge port 56 is formed by the peripheral ceiling portion 54 and the peripheral bottom portion 55. The present disclosure is not limited thereto, and a separate discharge port 56 may be formed between the peripheral ceiling portion 54 and the peripheral bottom portion 55.

Figure 5:
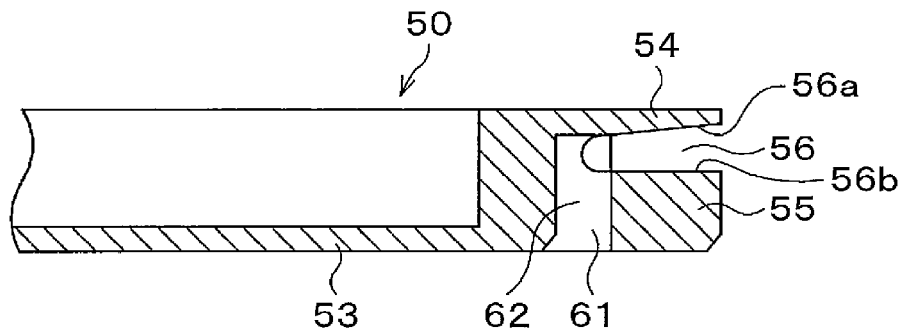
FIG. 5 is a cross-sectional view taken along line C-C in FIG. 2.

Arc-shaped holes 61 as illustrated in FIGS. 2 and 5 are formed at equal intervals in the peripheral bottom portion 55. The cleaning jig 50 according to the present embodiment is formed at twelve locations as illustrated in FIG. 2. As illustrated in FIG. 5, each of the holes 61 is formed in the peripheral bottom portion 55 to reach the inside of the discharge port 56 in the height direction. A guide path 62 leading from the inlet of the hole 61 to the discharge port 56 is thus formed. The discharge port 56 has an upper surface 56a and a lower surface 56b. In the present embodiment, the guide path 62 has a shape in which the cross-sectional area of a flow path increases toward the discharge port 56. The respective holes 61 are formed independently of each other to at least the lower surface 56b in each discharge port 56. Further, each hole 61 communicates with the lower surface 56b in the discharge port 56 at a position near the center of the cleaning jig 50 in plan view.

Figure 6:
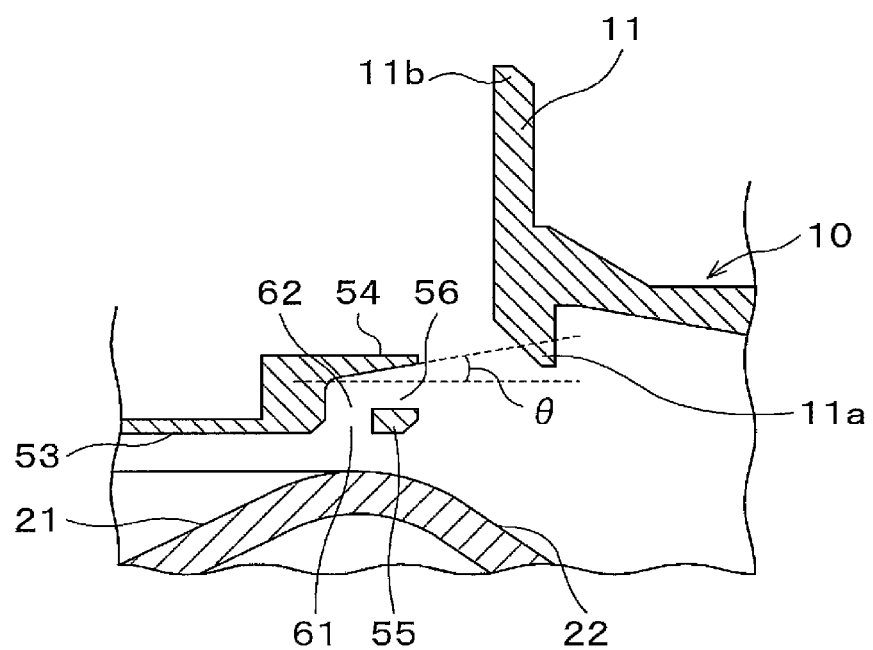
FIG. 6 is a view illustrating a positional relationship between a peripheral portion of the cleaning jig and an outer cup when the cleaning jig according to the embodiment is set on the spin chuck of the spin coating apparatus of FIG. 1.

FIG. 6 illustrates a positional relationship among the peripheral portion of the cleaning jig 50 having such a structure, the block body 11 of the outer cup 10, and the inner cup 20 when the cleaning jig 50 is held by the spin chuck 4. As illustrated in the drawing, the lower surface of the peripheral ceiling portion 54, that is, the upper surface 56a inside the discharge port 56 is inclined and directed obliquely upward from the horizontal plane at an elevation angle θ. The elevation angle θ may be arbitrarily set, for example, within a range of 5 degrees to 20 degrees. In the present embodiment, the lower end 11a of the block body 11 is set to be positioned within the range of the elevation angle θ. According to the knowledge of the inventors, during spin coating of the substrate, a large amount of the scattered coating liquid adheres to the lower end 11a of the block body 11 and the periphery thereof. Further, as illustrated in FIG. 6, the upper end 11b of the block body 11 is positioned above the elevation angle of the peripheral ceiling portion of the cleaning jig 50 held by the spin chuck 4, more specifically, above the extension line of the upper surface 56a inside the discharge port 56. In this example, the upper end 11b of the block body 11 is positioned above the range of the elevation angle θ.

<Cleaning Method>

The cleaning jig 50 according to the embodiment has the above-described configuration. Next, a cleaning method using the cleaning jig 50 will be described.

First, after performing a predetermined coating process on the wafer, the wafer is unloaded from the housing 2 of the spin coating apparatus 1. Thereafter, the cleaning jig 50 is loaded into the housing 2 and held by the spin chuck 4. As described above, the cleaning jig 50 has the same shape and size as the wafer except for the thickness, so that a transfer arm for transferring the wafer may be used as it is. Further, while the cleaning jig 50 is not used, the cleaning jig 50 may be kept waiting in a wafer storage place such as a buffer unit or a storage in the coating and developing apparatus in which the spin coating apparatus 1 of this type is mounted.

Figure 7:
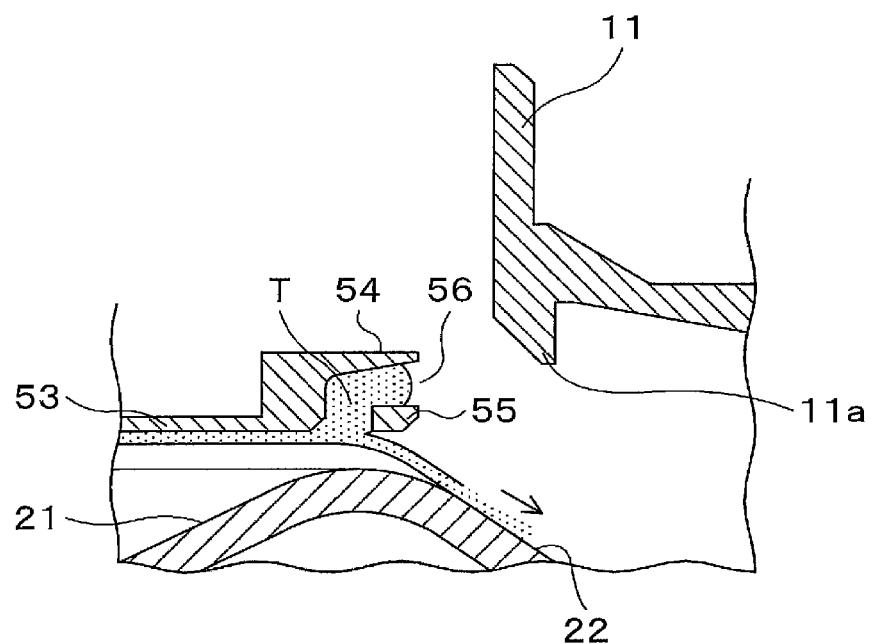
FIG. 7 is a view illustrating a state during relatively low-speed rotation in FIG. 6.

Next, while rotating the cleaning jig 50 at a relatively low speed, the cleaning liquid is supplied from the cleaning nozzle 31 toward the bottom portion 53 of the lower surface of the cleaning jig 50. Then, as illustrated in FIG. 7, the cleaning liquid flows along the surface of the bottom portion 53 to the outer periphery, and a part of the cleaning liquid falls onto the inner slope portion 21 and the outer slope portion 22 of the inner cup 20, and the surfaces thereof are cleaned by the cleaning liquid. The supply of the cleaning liquid to the inner slope portion 21 and the outer slope portion 22 is controlled by, for example, the discharge flow rate of the cleaning liquid and the rotational speed of the cleaning jig 50.

In this case, another part of the cleaning liquid flowing along the surface of the bottom portion 53 to the outer periphery enters the holes 61 of the peripheral bottom portion 55, flows over the entire periphery above the peripheral bottom portion 55, stays from the inlet of the hole 61 to the entire circumferential region above the peripheral bottom portion 55 due to surface tension, and forms a pool T of the cleaning liquid. In this case, each hole 61 communicates with the lower surface 56b in the discharge port 56 at a position near the center of the cleaning jig 50 in plan view, so that more cleaning liquid is stored from the inner part of the hole 61. As a result, the amount of pool T to be stored may be increased.

Figure 8:
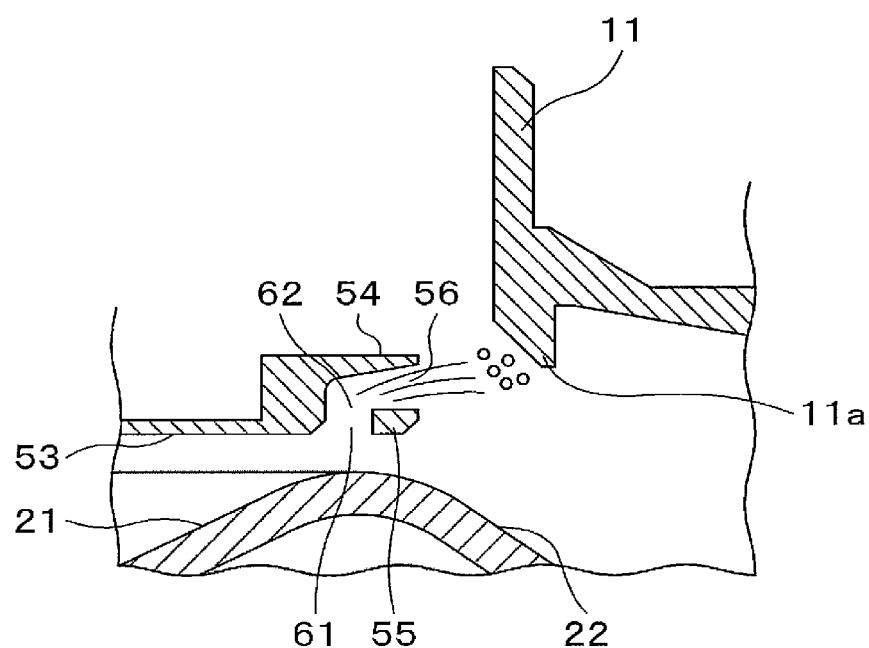
FIG. 8 is a view illustrating a state during relatively high-speed rotation from the state of FIG. 7.

After the cleaning of the inner slope portion 21 and the outer slope portion 22 of the inner cup 20 is completed, the cleaning jig 50 is then rotated at a relatively high speed. Then, as illustrated in FIG. 8, a pool T of the cleaning liquid formed from the inlet of the hole 61 of the cleaning jig 50 to the guide path 62 is pushed outward by the centrifugal force, and scatters from the discharge port 56 toward the lower end 11a of the block body 11 of the outer cup 10. As a result, the lower end 11a of the block body 11 and the surrounding area thereof are cleaned.

Therefore, it is possible to clean a wider area in the height direction as compared with the method of scattering the cleaning liquid in the horizontal direction. As described above, the cleaning liquid flows along the surface of the bottom portion 53 to the outer periphery, and a part of the cleaning liquid falls onto the inner slope portion 21 and the outer slope portion 22 of the inner cup 20 to clean the surfaces thereof. Therefore, according to the present embodiment, the cleaning liquid may be supplied in the scattering direction toward the block body 11 and the inner cup 20, respectively, and the cleaning may be performed efficiently without being affected by the staining state of each other.

Further, in the above-described embodiment, since the plurality of holes 61 are formed to the lower surface 56b in the discharge port 56 independently of each other, when the cleaning liquid rises from the bottom portion 53 of the cleaning jig 50 to the lower surface 56b in the discharge port 56, the cleaning liquid flows through a short flow path without interfering with each other. Thus, the cleaning liquid may be easily guided to the space inside the discharge port 56.

By adjusting the elevation angle θ illustrated in FIG. 6, it is possible to adjust such a scattering area of the cleaning liquid in the height direction. In this case, as for the maximum angle of the elevation angle θ, the upper end of the outer cup 10 (in this embodiment, the upper end 11b of the block body 11) may be positioned higher than the extended line of the lower surface of the peripheral ceiling portion 54. As a result, it is possible to more reliably suppress the mist of the cleaning liquid that scatters from the discharge port 56 from scattering to the outside of the outer cup 10.

In the present embodiment, the guide path 62 has a shape in which the cross-sectional area of the flow path increases toward the discharge port 56, so that the cleaning liquid in the pool T is not suppressed from scattering outward due to the centrifugal force. Therefore, it is possible to suitably scatter the cleaning liquid in the pool T.

In the present embodiment, the holes 61 have an arc shape in plan view. However, the present disclosure is not limited thereto, and other shapes of holes may be adopted and the number of holes 61 to be provided is not limited to this embodiment. Further, it is not necessary to make all holes the same size, and a combination of large holes and small holes may be arranged. As a result, it is possible to change the amount of the cleaning liquid scattering toward the outer cup 10 during the cleaning process, and to achieve an appropriate cleaning effect according to the state of the coating liquid adhering to the outer cup 10. From this point of view, the holes 61 do not necessarily need to be arranged at equal intervals.

In the above-described embodiment, the peripheral ceiling portion 54 and the peripheral bottom portion 55 have the same protruding length to the outside. However, the present disclosure is not limited thereto, and the protruding length of the peripheral bottom portion 55 may be longer than the protruding length of the peripheral ceiling portion 54. As a result, the scattering direction of the pool T may be made more orderly and scattered upward.

In the cleaning method for the outer cup 10 as described above, when the amount of the cleaning liquid in the pool T is insufficient, the cleaning jig 50 is again rotated at a relatively low speed, and the supply of the cleaning liquid from the cleaning nozzle 31 is resumed to form the pool T again. After that, the supply of the cleaning liquid from the cleaning nozzle 31 is stopped, and the cleaning jig 50 is rotated again at a relatively high speed. That is, a relatively low rotation together with a supply of the cleaning liquid from the cleaning nozzle 31 and a relatively high rotation together with a stoppage of the cleaning liquid supply from the cleaning nozzle 31 may be repeated. As a result, it is possible to eliminate the shortage of cleaning liquid for the outer cup 10.

It needs to be considered that the embodiments disclosed this time are illustrative in all respects and not restrictive. The embodiments described above may be omitted, substituted, or modified in various ways without departing from the scope and spirit of the appended claims.

DESCRIPTION OF SYMBOLS

1: spin coating apparatus
3: container
10: outer cup
20: inner cup
50: cleaning jig
54: peripheral ceiling portion
55: peripheral bottom portion
56: discharge port
61: hole
62: guide path
100: control unit
T: pool

What is claimed is:

1. A cleaning jig of a disc shape used for cleaning an inside of a container of a spin coating apparatus, including a rotary holder in communication with a nozzle, while the cleaning jig is held by the rotary holder in a same manner as a substrate in the spin coating apparatus that supplies a processing liquid onto the substrate held by the rotary holder disposed in the container and forms a film of the processing liquid on the substrate by rotating the substrate,
   wherein a peripheral ceiling portion and a peripheral bottom portion are formed over an entire periphery of the cleaning jig, and a peripheral edge extends between the peripheral ceiling portion and the peripheral bottom portion,
   a discharge port is formed to extend along the periphery between the peripheral ceiling portion and the peripheral bottom portion to an opening in the peripheral edge,
   a plurality of holes is formed in the peripheral bottom portion inward of the peripheral edge, at intervals in a circumferential direction to extend into the discharge port, and
   a lower surface of the peripheral ceiling portion is inclined toward the opening in the peripheral edge.

2. The cleaning jig according to claim 1, wherein the discharge port is formed by the peripheral ceiling portion and the peripheral bottom portion.

3. The cleaning jig according to claim 1, wherein a guide path formed between an inlet of each of the plurality of holes and the discharge port has a shape in which a cross-sectional area of a flow path increases toward the discharge port.

4. The cleaning jig according to claim 1, wherein each of the plurality of holes is arc-shaped in plan view.

5. The cleaning jig according to claim 1, wherein the peripheral bottom portion protrudes outward beyond the peripheral ceiling portion.

6. The cleaning jig according to claim 1, wherein the plurality of holes are formed independently of each other up to a lower surface within the discharge port.

7. The cleaning jig according to claim 1, wherein the plurality of holes communicate with the lower surface within the discharge port at a position near a center of the cleaning jig in plan view.

8. A cleaning method for cleaning the inside of the container of the spin coating apparatus using the cleaning jig according to claim 1, the cleaning method comprising:
   (A) while holding the cleaning jig by the rotary holder and rotating the cleaning jig at a relatively low speed, supplying a cleaning liquid outward from a lower surface of the cleaning jig and allowing the cleaning liquid to reach at least the holes to form a pool in the holes; and
   (B) thereafter, rotating the cleaning jig at a relatively high speed while the supply of the cleaning liquid is stopped.

9. The cleaning method according to claim 8, wherein in (A), a lower region of the cleaning jig in the container is cleaned by a portion of the supplied cleaning liquid.

10. The cleaning method according to claim 8, wherein (A) and (B) are repeated.

* * * * *